United States Patent
Greisen

(10) Patent No.: US 8,357,934 B2
(45) Date of Patent: *Jan. 22, 2013

(54) SEMICONDUCTOR-BASED SUB-MOUNTS FOR OPTOELECTRONIC DEVICES WITH CONDUCTIVE PATHS

(75) Inventor: Christoffer G. Greisen, Valby (DK)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 55 days.

This patent is subject to a terminal disclaimer.

(21) Appl. No.: 12/938,467

(22) Filed: Nov. 3, 2010

(65) Prior Publication Data

US 2011/0101350 A1 May 5, 2011

Related U.S. Application Data

(63) Continuation of application No. 12/409,859, filed on Mar. 24, 2009, now Pat. No. 7,838,878.

(51) Int. Cl.
*H01L 23/58* (2006.01)
(52) U.S. Cl. ............ 257/48; 257/88; 257/684; 257/685; 257/690; 257/698; 257/734
(58) Field of Classification Search .................... 257/48, 257/88, 684, 685, 690, 698, 734
See application file for complete search history.

(56) References Cited

U.S. PATENT DOCUMENTS

| | | | |
|---|---|---|---|
| 6,818,464 | B2 | 11/2004 | Heschel |
| 2005/0241135 | A1 | 11/2005 | Heschel et al. |
| 2006/0210234 | A1 | 9/2006 | Shiv et al. |
| 2008/0076195 | A1 | 3/2008 | Shiv |
| 2008/0290353 | A1 | 11/2008 | Medendorp, Jr. et al. |
| 2009/0181500 | A1 | 7/2009 | Kuhmann et al. |
| 2009/0194777 | A1 | 8/2009 | Murphy |
| 2009/0321760 | A1 | 12/2009 | Kuhmann |

OTHER PUBLICATIONS

HyLed™-700—Preliminary Product brief, "Engineered Silicon Package for Solid State lighting Applications," Hymite A/S, Jan. 1, 2009, version 4.0, 2 pages.
Tom Murphy and Jochen Kuhmann, "Silicon wafer packaging for HB-LEDs—Technology White Paper," Hymite Issue 1.0, Sep. 2007, pp. 1-10.
Luxeon® Product, Application Brief AB21, "Binning and labeling," Phillips Lumileds Lights Company, 2007, 8 pages.

*Primary Examiner* — Long Pham
(74) *Attorney, Agent, or Firm* — Haynes and boone, LLP

(57) ABSTRACT

The disclosure facilitates testing and binning of multiple LED chip or other optoelectronic chip packages fabricated on a single semiconductor wafer. The testing can take place prior to dicing. For example, in one aspect, metallization on the front-side of a semiconductor wafer electrically connects together cathode pads (or anode pads) of adjacent sub-mounts such that the cathode pads (or anode pads) in a given column of sub-mounts are electrically connected together. Likewise, metallization on the back-side of the wafer electrically connects together anode pads (or cathode pads) of adjacent sub-mounts such that the anode pads (or cathode pads) in a given row of sub-mounts are electrically connected together. Probe pads, which can be located one or both sides of the wafer, are electrically connected to respective ones of the rows or columns.

20 Claims, 4 Drawing Sheets

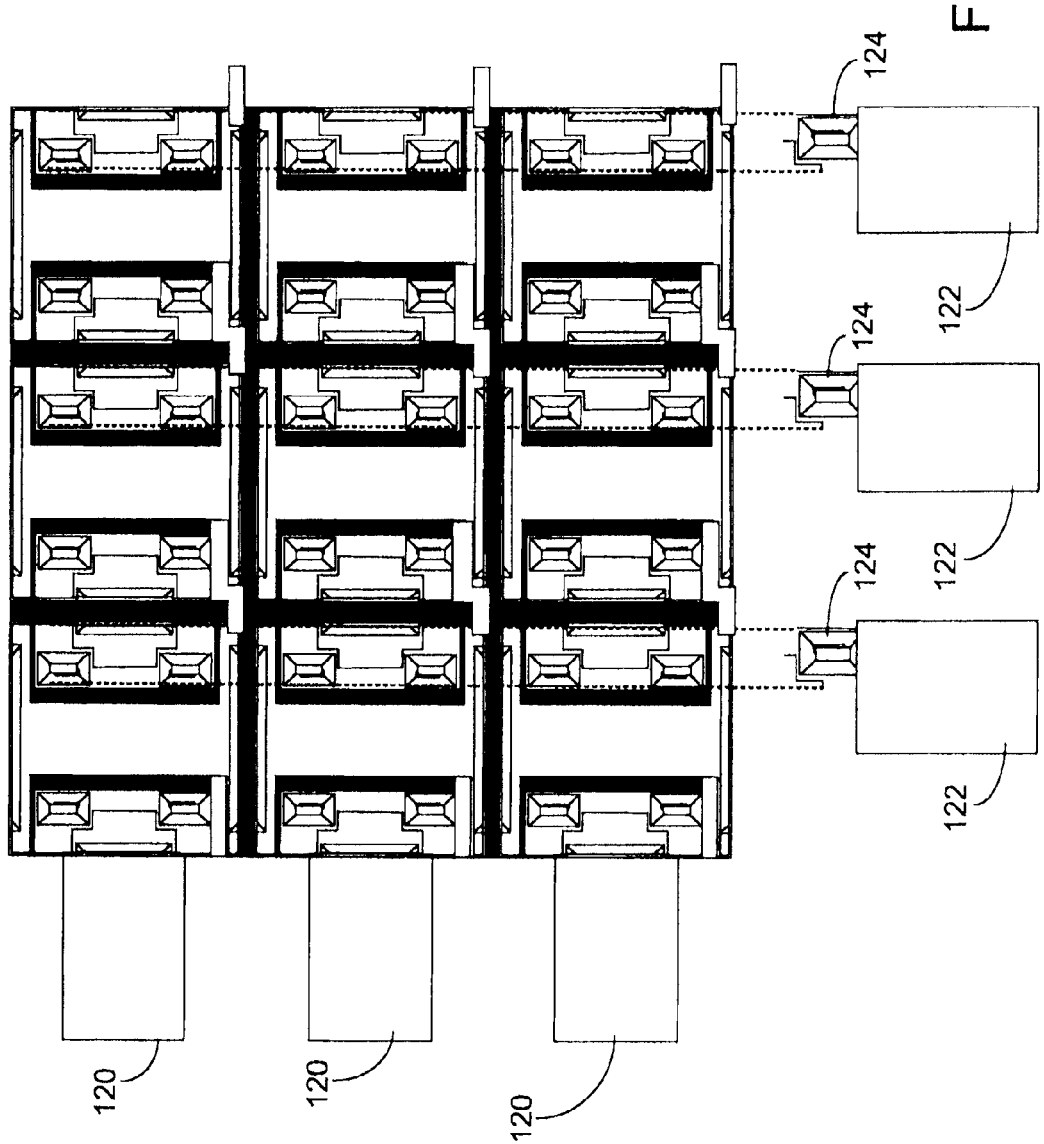

SEMICONDUCTOR-BASED SUB-MOUNTS FOR OPTOELECTRONIC DEVICES WITH CONDUCTIVE PATHS

CROSS REFERENCE

This patent is a continuation of U.S. Ser. No. 12/409,859, filed Mar. 24, 2009, the disclosure of which is incorporated herein by reference.

TECHNICAL FIELD

The present disclosure relates to semiconductor-based sub-mounts for optoelectronic devices with conductive paths to facilitate testing and binning.

BACKGROUND

Optoelectronic devices, such as light emitting diodes (LEDs), have various applications in consumer electronics. Some LEDs, for example, are used as light sources in space-limited applications where thermal management is important. The LEDs are optimized for display backlighting and illumination in automotive and transport, consumer, and general applications. Typical end-products include mobile telephone displays, flashes for cameras, retail and window displays, emergency lighting and signs, household appliances, and automotive instrument panels and exterior lighting, such as brake lights and turn signals.

The manufacturing of LED and other optoelectronic devices results in variations in performance of the devices around average values that may be provided, for example, in technical data sheets. Examples of such variations include variations in the spectrum of radiation emitted by the LEDs. Factors contributing to such variations include, among other things, variations in the fabrication process and variations in color-conversion materials often used to control the color of the light emitted from the LED package.

Following assembly, optoelectronic packages, such as LED packages, typically are performance tested and "binned" (i.e., sorted) according to ranges of dominant wavelength and brightness. Such binning permits intensity and/or color matching between various packages to be used in a particular product or product line. Testing and binning, however, can consume substantial resources of labor and or equipment.

SUMMARY

The details of one or more implementations of the invention are set forth in the description below and the accompanying drawings. Various aspects of the invention are set forth in the claims.

In some implementations, the invention facilitates testing and binning of multiple LED chip packages fabricated on a single semiconductor wafer. The testing can take place prior to dicing. Thus, some implementations permit LED packages or other optoelectronic device packages to be tested and binned quickly and efficiently using a relatively small number of probes pads prior to dicing the semiconductor wafer into individual packages or assemblies.

For example, in one aspect, metallization on the front-side of a semiconductor wafer electrically connects together cathode pads (or anode pads) of adjacent sub-mounts such that the cathode pads (or anode pads) in a given column of sub-mounts are electrically connected together. Likewise, metallization on the back-side of the wafer electrically connects together anode pads (or cathode pads) of adjacent sub-mounts such that the anode pads (or cathode pads) in a given row of sub-mounts are electrically connected together. Probe pads, which can be located on one or both sides of the wafer, are electrically connected to respective ones of the rows or columns.

Some aspects have particular applicability to LEDs. For example, according to an aspect of the invention, an array of sub-mounts includes a silicon substrate forming a two-dimensional array of sub-mounts for LEDs. The array includes respective columns and rows of sub-mounts. Each sub-mount includes a recess in a front-side of the substrate, the recess defined by sidewalls and a bottom surface. A die attach pad for the LED, as well as an anode pad and a cathode pad, are on the bottom surface of the recess. Each sub-mount includes feed-through metallization that electrically couples the anode pad to a first contact pad (e.g, a SMD pad) on the back-side surface of the substrate, and feed-through metallization that electrically couples the cathode pad to a second contact pad (e.g., SMD pad) on the back-side surface of the substrate. The array includes a first group of electrical paths each of which electrically connects together all the cathode pads in a respective column of sub-mounts, and a second group of electrical paths each of which electrically connects together all the anode pads in a respective row of sub-mounts. The array includes probe pads each of which is electrically connected to a respective one of the electrical paths in the first or second groups. Preferably, there is a one-to-one correspondence between the probe pads and the rows and columns in the array.

In some implementations, the probe pads for the rows and columns are located on different sides of the semiconductor substrate (e.g., the front-side and back-side, respectively). In other implementations, all the probes are located on the same side of the semiconductor substrate.

Although some aspects of the invention have particular applicability to LEDs, the invention can be used with other optoelectronic devices as well.

Other features and advantages will be apparent from the following detailed description, the accompanying drawings, and the claims.

BRIEF DESCRIPTION OF THE DRAWINGS

FIG. 5 is a back-side view of a wafer with probe pads.

DETAILED DESCRIPTION

Figure 1:
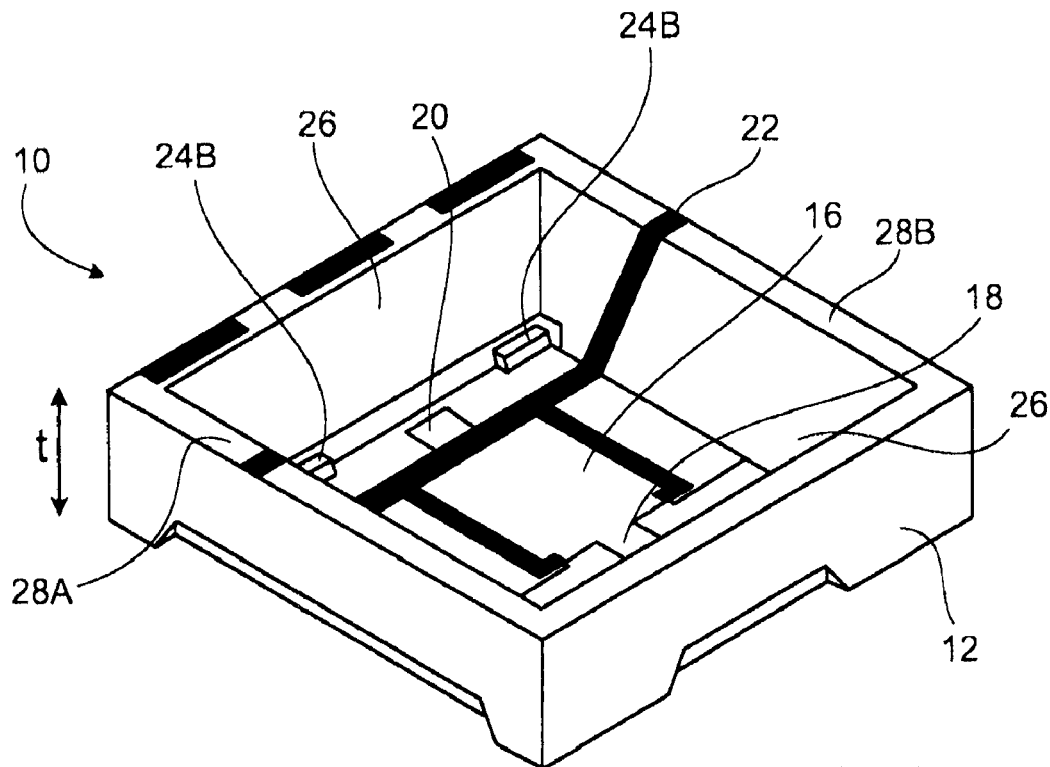
FIG. 1 is a front-side view showing an example of a sub-mount.
Figure 2:
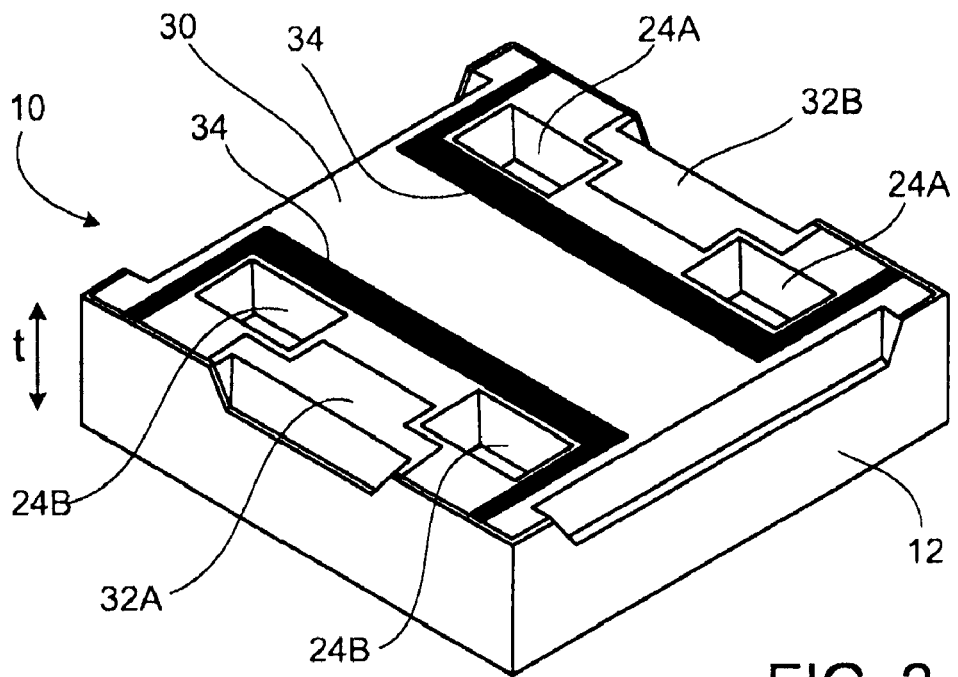
FIG. 2 is a back-side view of the sub-mount of FIG. 1.

As shown in FIGS. 1 and 2, a sub-mount 10 for an optoelectronic device, such as a LED chip, includes a semiconductor (e.g., silicon) substrate 12. The substrate has an overall thickness (t), for example, in the range of 350 µm-700 µm, and preferably in the range of 400 µm-600 µm. The LED chip can be mounted on a thin membrane portion of the substrate at the bottom of a recess in the front-side surface of the substrate 12. The sub-mount can be fabricated, for example, in a wafer-level batch process using standard 4-inch to 8-inch diameter silicon wafers.

As shown in FIG. 1, the front-side of the sub-mount 10 includes a die attach pad 16 on which the LED chip (or other optoelectronic chip) can be mounted. The die attach pad 16 is electrically connected to a first contact pad (e.g., an anode pad) 18 on the front-side surface of the substrate 12. A second contact pad (e.g., a cathode pad) 20 also is located on the front-side surface of the substrate 12. Thus, each of the pads 16, 18, is located within the recess in the front-side surface of the substrate 12. Gold or silver, for example, can be used as the metallization for the die attach pad 16 as well as the anode and cathode pads 18, 20. Isolation regions (e.g., silicon oxide (SiO$_2$)) 22 provide electrical isolation between the pads.

When a LED chip is mounted on the die attach pad 16, an anode terminal at the bottom of the LED chip is in electrical contact with the die attach pad, which, in turn, is electrically connected to the anode pad 18. A cathode terminal at the top of the LED chip can be electrically connected to the cathode pad 20 by way of a wire bond, for example. The sidewalls 26 of the recess are metallized to provide a reflective surface so as to increase the amount of light directed out of the package. In addition, the top surfaces of ridges on the front-side of the sub-mount at the top of the sidewalls 26 are metallized (see 28B in FIG. 1) so that at least part of the top surface is in electrical contact (through the metallization) with the cathode pad 20. Solder dams can be used to prevent solder from flowing onto other areas during fabrication. As described in greater detail below, the respective cathode pads 20 in each column of sub-mounts on the wafer can electrically be connected together through use of the metallized surfaces 28B the ridges to facilitate testing of the LED chips.

As illustrated in FIGS. 1 and 2, via structures 24A, 24B extend from the bottom of the recess on the front-side (i.e., LED side) to the back-side (i.e., SMD side) of the substrate 12. Feed-through metallization in the via structures 24A provides electrical through-wafer interconnections between the anode pad 18 on the front-side of the sub-mount 10 to a respective SMD pad located on the back-side of the sub-mount. Likewise, feed-through metallization in the via structures 24B provides electrical through-wafer interconnections between the cathode pad 20 on the front-side of the sub-mount 10 to a respective SMD pad located on the back-side of the sub-mount. In the illustrated example, two via structures 24A are provided for electrical connection from the anode 18, and two via structures 24B are provided for electrical connection from the cathode 20. In some implementations, a single via structure for the anode connection and a single via structure for the cathode connection may be sufficient. However, using multiple via structures with feed-through metallization for each of the anode and cathode can increase the amount of current that can be handled.

The recess and through-wafer interconnections can be provided, for example, using techniques described in U.S. Patent Publication No. 2008/0076195, the disclosure of which is incorporated herein by reference. That patent application describes double-sided etching techniques that include use of a sacrificial membrane (e.g., SiO$_2$) during formation of the through-wafer interconnections. According to a particular example, micro-vias are etched in the back-side of a silicon wafer. An etch stop layer is provided over the back-side and covers surfaces in the micro-vias. A larger recess is etched in the front-side of the wafer to a depth such that portions of the etch stop layer are exposed in the recess in areas where the micro-vias were etched. Metallization is deposited over one side of the wafer, and regions of the etch stop layer subsequently are removed from areas corresponding to where the micro-vias were etched. Metallization is deposited over the other side of the wafer so that the metallization deposited over the first side is in contact with the metallization deposited over the second side to form the through-wafer interconnections.

FIG. 2 illustrates an example of the back-side of the sub-mount 10 (i.e., the SMD side), which includes a thermal pad 30 for heat transfer away from the LED chip. The thermal pad 30 can be formed, for example, of solderable metallization suitable for, e.g., tin/silver alloy. The via structures 24A, 24B with the feed-through metallization are visible at the SMD side as well. Regions of solderable metal 32A, 32B, such as gold, nickel, copper or silver, for example, serve as leadless SMD contacts for the anode and cathode. Solder dams can be used to prevent solder from flowing onto other areas during fabrication. Isolation regions (e.g., SiO$_2$) 34 electrically separate the thermal pad 30 from the cathode SMD contact 32B and, in some cases, from the anode SMD contact 32A as well. Bevel structures (e.g., v-grooves) can facilitate inspection of the sub-mount after soldering, for example, on a printed circuit board (PCB). As explained in greater detail below, the respective anode pads 18 in each row of sub-mounts on the wafer can electrically be connected together through use of portions of the back-side metallization to facilitate testing of the LED chips.

Figure 3:
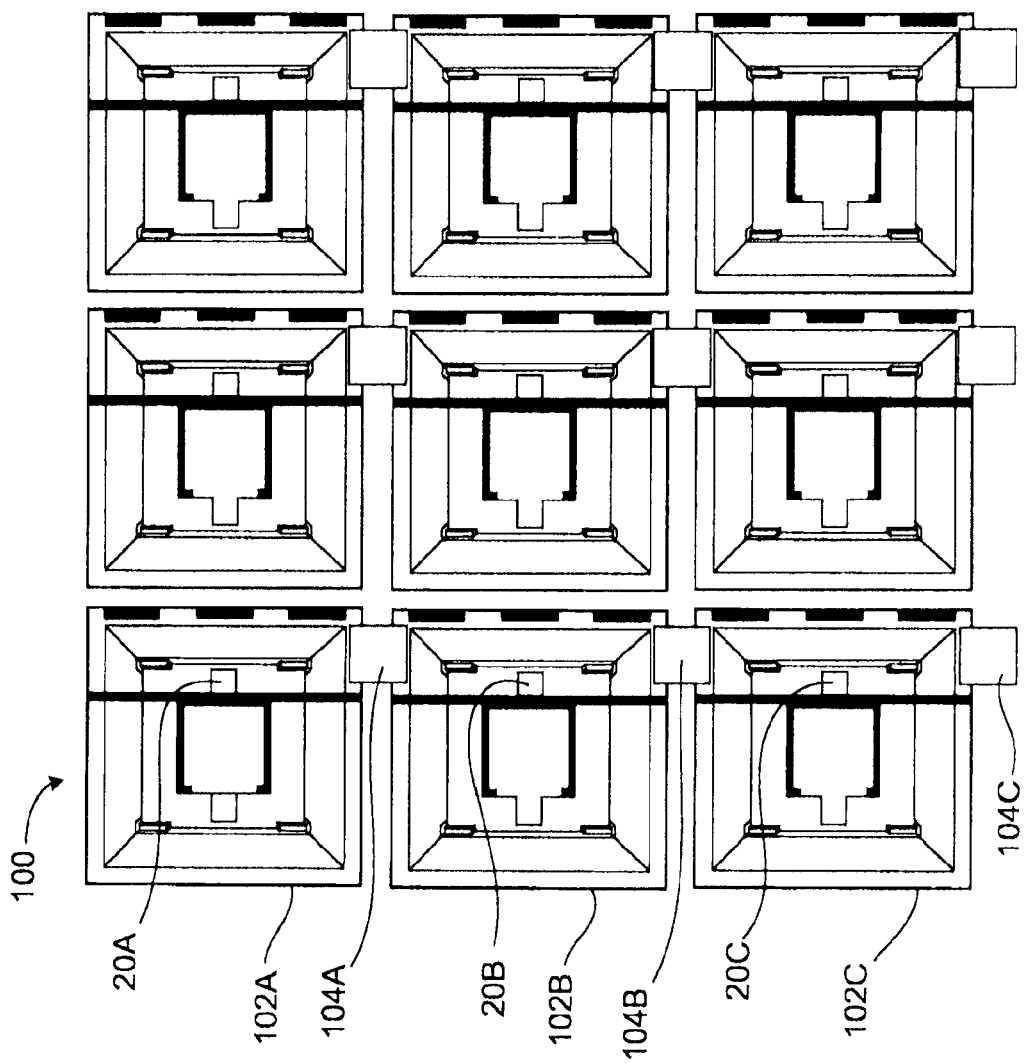
FIG. 3 is a front-side view of a portion of a semiconductor wafer illustrating a 3×3 array of sub-mounts.
Figure 4:
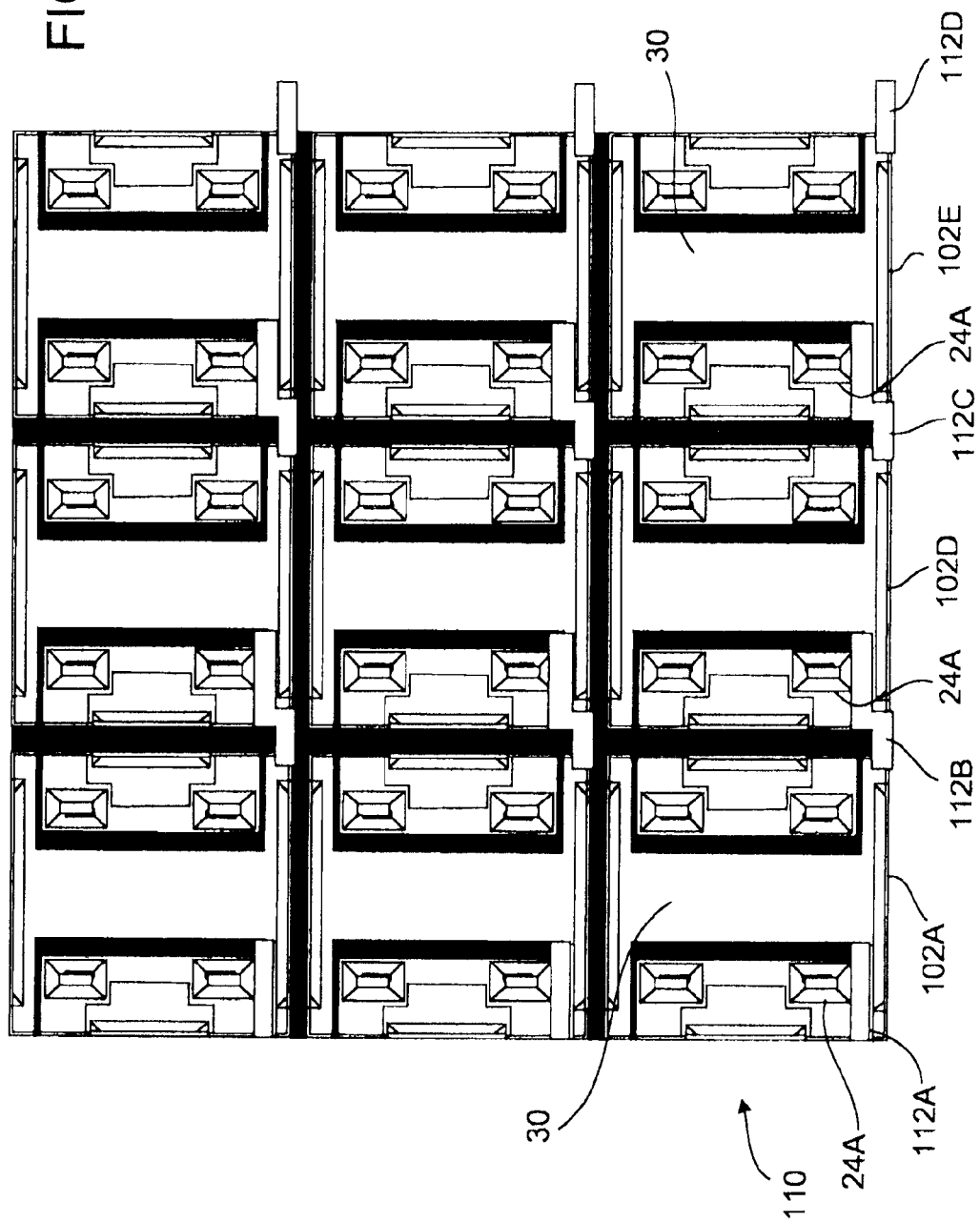
FIG. 4 is a back-side view of the wafer of FIG. 3.

A typical semiconductor wafer can be processed to fabricate multiple sub-mounts. FIGS. 3 and 4 illustrate a portion of a wafer including a 3×3 array of sub-mounts prior to dicing the wafer into individual sub-mounts or packages. FIG. 3 illustrates the front-side of the wafer, and FIG. 4 illustrates the back-side of the wafer. In the illustrated example, metallization on the front-side of the wafer electrically connects together cathodes of adjacent sub-mounts such that all the cathodes in a given column of sub-mounts are electrically connected together. Likewise, metallization on the back-side of the wafer electrically connects together anodes 18 of adjacent sub-mounts such that all the anodes in a given row of sub-mounts are electrically connected together.

For example, as illustrated in FIG. 3, sub-mounts 102A, 102B, 102C are in the same column 100 of the array on the silicon wafer. Each sub-mount has a respective cathode pad (e.g., 20A, 20B, 20C). Metallization 104A, 104B, 104C between adjacent sub-mounts in the particular column 100 serves as part of an electrical path to connect together all the cathode pads 102A, 102B, 102C in the column. As illustrated in FIG. 3, the metallization 104A, 104B, 104C between adjacent sub-mounts connects the metallization 28B on the ridges (see FIG. 1) of adjacent sub-mounts. For example, metallization 104A connects the metallization 28B on the ridges of sub-mounts 102A and 1028; likewise, metallization 104B connects the metallization 28B on the ridges of sub-mounts 102B and 102C. Additional sub-mounts in the column 100 are connected electrically in a similar fashion. Thus, an electrical path that connects all the cathode pads 20 in the column 100 includes the metallization (104A, 104B, 104C) between adjacent sub-mounts, the metallization 28B on the ridges on the front-side surface of each sub-mount, the metallization on the sidewalls 26, and the metallization at the bottom of the recess surrounding each cathode pad 20. This arrangement takes advantage of the low resistance and good electrical connection of the mirror metallization on the sidewalls 26. The cathode pads in each respective column of the sub-mount array on the wafer are connected electrically to one another in a similar fashion. The result is that all the cathode pads on the sub-mounts in any given column on the wafer are electrically connected to one another.

As illustrated in FIG. 4, sub-mounts 102A, 102D, 102E are in the same row 110 of the array on the silicon wafer. Back-side metallization 112A, 112B, 112C, 112D between adjacent sub-mounts in the particular row 110 serves as part of an electrical path to connect together the feed-through metallization in the via structures 24A (see FIG. 2) for all the anode pads in the row. As illustrated in FIG. 4, the metallization 112A, 112B, 112C, 112D connects feed-through metallization in the via structures 24A of adjacent sub-mounts. In the illustrated example, metallization 112A connects the feed-through metallization in the via structure 24A of sub-mount 102A to the metallization for the thermal pad 30 on the same sub-mount. Metallization 112B at a far side of the thermal pad 30 of sub-mount 102A is connected to the feed-through metallization in the via structure 24A of sub-mount 102D and to the metallization for the thermal pad 30 of sub-mount 102D. Likewise, metallization 112C at a far side of the thermal pad 30 of sub-mount 102B is connected to the feed-through metallization in the via structure 24A of sub-mount 102E and to the metallization for the thermal pad 30 of sub-mount 102E.

Additional sub-mounts in the row 110 are connected electrically in a similar fashion. Thus, an electrical path that connects all the anode pads in the row 110 includes front-side metallization at the bottom of the recess surrounding each anode pad 18, the feed-through metallization in the via structures 24A and the back-side metallization surrounding the feed-through metallization in the via structures 24A, the back-side metallization (112A, 112B, 112C) between adjacent sub-mounts, and the back-side metallization for the thermal pads 30. The anode pads in other rows of the sub-mount array on the wafer are connected electrically to one another in a similar fashion. The result is that all the anode pads on the sub-mounts in each particular row on the wafer are electrically connected to one another.

In the foregoing example, the back-side metallization for the thermal pads 30 is not electrically isolated from the feed-through metallization in the via structures 24A and serves as part of the electrical path that connects the anode pads 18 in a particular row of the array. In other implementations, it may be preferable that the thermal pads 30 be electrically isolated from the other back-side metallization. In that case, the shape of the thermal pads 30 can be modified so that the thermal pads do not form part of the electrical path that connects together the anode pads in a particular row of the array. For example, a narrow isolation region (e.g., $SiO_2$) can separate the thermal pad 30 from the back-side metallization that is part of the electrical path connecting the row of anode pads.

In the example of FIGS. 3 and 4, the cathode pads 20 for each column of sub-mounts are connected together electrically by front-side (i.e., LED-side) metallization, and the anode pads 18 for each row of sub-mounts are connected together electrically primarily by back-side (i.e., SMD-side) metallization. In other implementations, the reverse scenario is used such that the cathode pads 20 for each column of sub-mounts are connected together electrically primarily by back-side (i.e., SMD-side) metallization, and the anode pads 18 for each row of sub-mounts are connected together electrically by front-side (i.e., LED-side) metallization. In either case, the column and line (i.e., row) metallization can be deposited at the same time as other front and back-side metallization. Conductive probe pads are provided, for example, at the end of each line (i.e., row) and column (e.g., along the periphery of the wafer).

The column and line (i.e., row) metallization can facilitate testing of LEDs chips subsequently mounted on the die attach pads 16. In particular, for a wafer with a X×Y array of sub-mounts (i.e., X columns and Y rows), the packaged LED chips can be addressed individually one-at-a-time with a stationary probe card using only X+Y probes. Thus, for example, assuming a 100×100 array, the LED chips can be accessed individually using only 200 probes. By applying a voltage between the probes for one row and one column, only one LED chip (electrically connected to corresponding anode and cathode pads 18, 20) is addressed at a time. The foregoing designs allow the testing to be performed prior to dicing the wafer into individual packages so as to facilitate testing at the wafer level. For example, color spectrum and efficiency (e.g., flux, color and forward voltage) can be measured after applying fluorescent silicone over the LED chip, but prior to die singulation. This can result in faster, more efficient testing and proper binning of the complete LED packages. For example, properties of the completed package may influence which bin a particular package belongs to. Therefore, characterizing the encapsulated LED packages at the wafer level prior to dicing can improve the binning process. The subsequent dicing process should take account of the need to cut through the additional metallization between adjacent sub-mounts.

The foregoing designs, in which probes are applied to probe pads at the end of each row and column, can eliminate the need to probe the individual LED packages themselves. This can improve reliability and can remove the need for dedicated probing pads on the individual LED packages.

The foregoing designs, in which the conductive row and column lines are on opposite sides of the wafer, may require the use of a two-sided probe testing station. In some implementations, additional vias with feed-through metallization are provided to route one set of the conductive lines (either columns or rows) to the opposite side of the wafer so that all probe pads are located on the same side of the wafer. An example is illustrated in FIG. 5 which shows the back-side of the wafer. A first set of probes pads 120 and a second set of probe pads 122 are visible on the back-side of the substrate. Each probe pad 120 in the first set is electrically connected to a respective one of the rows. Each probe pad 122 in the second set is electrically connected to a respective one the columns. Feed-through metallization in additional vias 124 that extend through the substrate electrically connects each of the front-side conductive lines for the columns to a corresponding one of the probe pads 122. In this way, the probe pads 120 for the rows as well as the probe pads 122 for the columns are located on the same side (e.g., the back-side) of the wafer. The dotted lines indicate that the cathode pads (on the front-side of the wafer) in each column are electrically connected to one another by metallization on the front-side of the wafer (i.e., the opposite side from that shown in FIG. 5). In other implementations, feed-through metallization can be provided to electrically connect each of the back-side conductive lines for the rows to a corresponding probe pad on the front-side of the wafer. In this way, the probe pads for the rows as well as the probe pads for the columns can be located on the front-side of the wafer.

Additional advantages may be present in some implementations. For example, in some implementations, only one pick-and-place process is needed between dicing and shipment. Binning data can be recorded and used when the LED packages are picked and placed on reels after the dicing process. Additionally, a thermographic camera on the via side, for example, can be used to detect poor thermal coupling between the LED chip and the sub-mount.

Other implementations are within the scope of the claims.

What is claimed is:

1. A semiconductor structure comprising:
   a semiconductor substrate comprising a group of sub-mounts, wherein each sub-mount comprises:
     a die attach pad and first and second contact pads inside a recess defined in a front-side of the substrate, and
     feed-through metallization in via structures extending from a surface within the recess to a back-side surface of the substrate, wherein the feed-through metallization in at least one of the via structures electrically couples the first contact pad on the front-side surface of the substrate to a first pad on the back-side surface of the substrate, and wherein the feed-through metallization in at least one other via structure electrically couples the second contact pad on the front-side surface of the substrate to a second pad on the back-side surface of the substrate;

first conductive line on the substrate, wherein the first conductive line forms part of a first electrical path that electrically connects together one of the first contact pads or the second contact pads from each sub-mount in the group of sub-mounts; and second conductive line on the substrate, wherein the second conductive line forms part of a second electrical path that electrically connects together one of the first contact pads or the second contact pads in each sub-mount in the group of sub-mounts, such that the first conductive line and the second conductive line are not directly connected.

2. The semiconductor structure of claim 1 wherein the first electrical path comprises metallization on respective sidewalls of the recess in the front-side surface of each sub-mount in the group and further comprises metallization on respective ridges at tops of the sidewalls of the recess of each sub-mount in the group.

3. The semiconductor structure of claim 2 wherein the first electrical path comprises metallization electrically connected to the feed-through metallization that electrically couples the second contact pad on the front-side surface of the substrate to the second pad on the back-side surface of the substrate.

4. The semiconductor structure of claim 3 wherein the second electrical path comprises a respective thermal pad on the back-side of each substrate.

5. The semiconductor structure of claim 1 further comprising a plurality of probe pads each of which is electrically connected to a respective one of the first or second conductive lines and are disposed along a periphery of the semiconductor structure.

6. The semiconductor structure of claim 5 wherein the number of probes equals the sum of the number of sub-mounts in the group.

7. The semiconductor structure of claim 1 further comprising:
a first probe pad on the front-side of the substrate, wherein the first probe pad is electrically connected to the first conductive line; and
a second probe pad on the back-side of the substrate, wherein the second probe pad is electrically connected to the second conductive line.

8. The semiconductor structure of claim 1 further comprising feed-through metallization in an additional via structure extending through the substrate, wherein the feed-through metallization electrically connects the first conductive lines on the front-side of the substrate to a probe pad on the back-side of the substrate.

9. The semiconductor structure of claim 1 further comprising feed-through metallization in an additional via structure extending through the substrate, wherein the feed-through metallization electrically connects the second conductive lines on the back-side of the substrate to a probe pad on the front-side of the substrate.

10. The semiconductor structure of claim 1 wherein the first and second contact pads are anode and cathode pads.

11. The semiconductor structure of claim 10 including a respective optoelectronic device mounted on each die attach pad, wherein terminals of the optoelectronic device are respectively coupled electrically to the anode and cathode pad located within the same recess as the die attach pad.

12. The semiconductor structure of claim 11 wherein the optoelectronic devices mounted on the die attach pads are light emitting diodes.

13. A structure comprising:
a silicon substrate forming a group of sub-mounts, the sub-mounts for mounting light emitting diodes, wherein each sub-mount comprises:
a recess in a front-side of the substrate, the recess defined by sidewalls and a bottom surface, wherein a die attach pad for a light emitting diode, an anode pad and a cathode pad are on the bottom surface of the recess, and
feed-through metallization electrically coupling the anode pad to a first contact pad on the back-side surface of the substrate, and feed-through metallization electrically coupling the cathode pad to a second contact pad on the back-side surface of the substrate;
a first group of electrical paths each of which electrically connects together all the cathode pads in the group of sub-mounts;
a second group of electrical paths each of which electrically connects together all the anode pads in the group of sub-mounts; and
a plurality of probe pads each of which is electrically connected to a respective one of the electrical paths in the first or second groups.

14. The structure of claim 13 comprising:
a first set of probes pads on the front-side of the substrate, wherein each probe pad in the first set is electrically connected to a respective one of the electrical paths in the first group; and
a second set of probes pads on the back-side of the substrate, wherein each probe pad in the second set is electrically connected to a respective one of the electrical paths in the second group.

15. The structure of claim 13 comprising:
a first set of probes pads on the front-side of the substrate, wherein each probe pad in the first set is electrically connected to a respective one of the electrical paths in the second group; and
a second set of probes pads on the back-side of the substrate, wherein each probe pad in the second set is electrically connected to a respective one of the electrical paths in the first group.

16. The structure of claim 13 further comprising additional feed-through metallization extending through the substrate, wherein the additional feed-through metallization electrically connects a respective one of the first electrical paths on the front-side of the substrate to a respective probe pad on the back-side of the substrate.

17. The structure of claim 13 further comprising additional feed-through metallization extending through the substrate, wherein the additional feed-through metallization electrically connects a respective one of the second electrical paths on the back-side of the substrate to a respective probe pad on the front-side of the substrate.

18. The structure of claim 13 wherein the plurality of probe pads are disposed along a periphery of the array.

19. The structure of claim 13 wherein the probe pads electrically connected to the first group of electrical paths and the probe pads electrically connected to the second group of electrical paths are located on the same side of the substrate.

20. A semiconductor structure comprising:
a semiconductor substrate comprising a two-dimensional array of sub-mounts, the array comprising respective lines of sub-mounts in a first dimension and respective lines of sub-mounts in a second dimension, wherein each sub-mount comprises:

a die attach pad for mounting a light emitting device on a front-side of the substrate, and first and second contact pads on the front-side of the substrate, and feed-through metallization in via structures extending from a surface within the recess to a back-side surface of the substrate, wherein the feed-through metallization in at least one of the via structures electrically couples the first contact pad on the front-side surface of the substrate to a first pad on the back-side surface of the substrate, and wherein the feed-through metallization in at least one other via structure electrically couples the second contact pad on the front-side surface of the substrate to a second pad on the back-side surface of the substrate;

a first group of conductive paths each of which electrically connects together all the first contact pads in a respective line of sub-mounts in the first dimension; and a second group of conductive paths each of which electrically connects together all the second contact pads in a respective line of sub-mounts in the second dimension.

\* \* \* \* \*